United States Patent [19]

Whiteley

[11] Patent Number: 4,622,475
[45] Date of Patent: Nov. 11, 1986

[54] DATA STORAGE ELEMENT HAVING INPUT AND OUTPUT PORTS ISOLATED FROM REGENERATIVE CIRCUIT

[75] Inventor: Stephen R. Whiteley, Beaverton, Oreg.

[73] Assignee: Tektronix, Inc., Beaverton, Oreg.

[21] Appl. No.: 585,948

[22] Filed: Mar. 5, 1984

[51] Int. Cl.⁴ ..................... H03K 3/287; H03K 3/288
[52] U.S. Cl. .................................... 307/289; 307/291; 307/530; 365/154
[58] Field of Search ...................... 307/289, 291, 530; 365/154

[56] References Cited

U.S. PATENT DOCUMENTS 4,264,832  4/1981  Furman ............................... 307/355
4,506,170  3/1985  Mizuide ............................... 307/291

Primary Examiner—John Zazworsky
Attorney, Agent, or Firm—George T. Noe

[57] ABSTRACT

A data storage element having input and output ports isolated from a regenerative latch portion so that the data transmission path is not through the latch. The circuit arrangement provided greatly reduces the probability of a metastable occurrence and permits data acquisition at a high rate with minimal error, and thus is suitable for use in high-speed digital shift registers.

2 Claims, 1 Drawing Figure

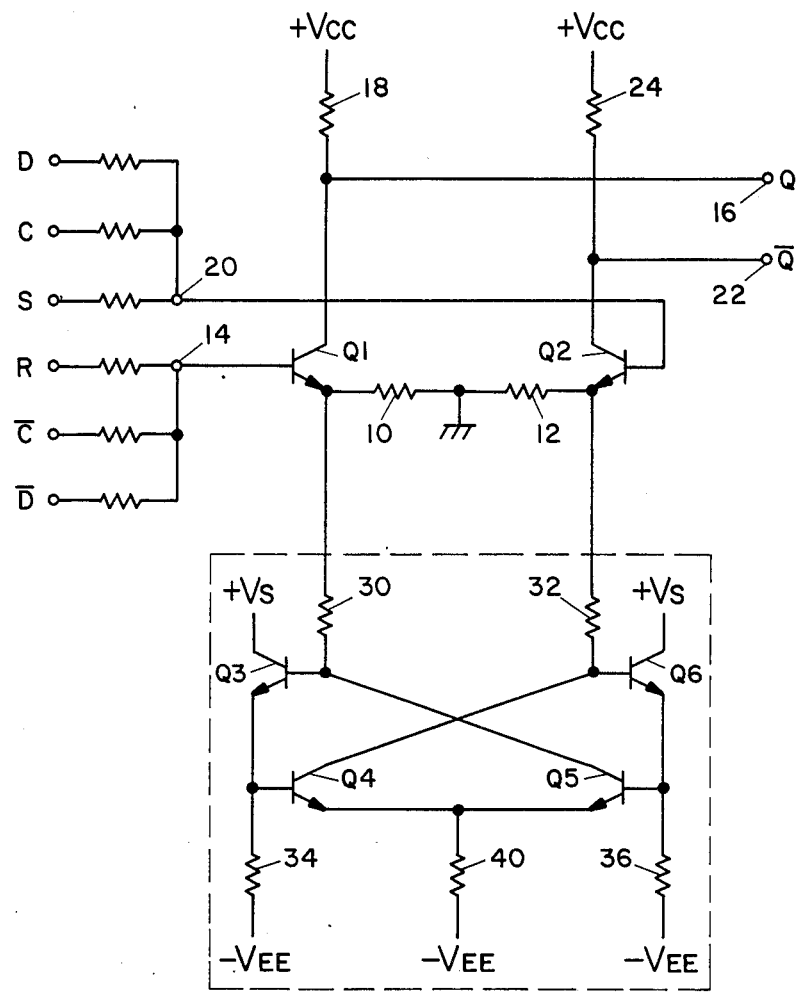

DATA STORAGE ELEMENT HAVING INPUT AND OUTPUT PORTS ISOLATED FROM REGENERATIVE CIRCUIT

BACKGROUND OF THE INVENTION

The present invention relates to logic circuits for data storage in general, and in particular to a data storage element such as a flip-flop having input and output ports which are isolated from the regenerative switching circuit.

Data storage elements, such as flip-flops, latches, and multivibrators, are among the basic building blocks for digital logic circuits. These elements are commercially available in a wide variety of types and complexities, depending upon the intended use. They have in common, however, a pair of output ports which are complementary (one at a high binary level while the other is low) and a regenerative loop to ensure switching from one stable state to another (and thereby causing the outputs to switch states) when activated by some input condition. The regenerative switching circuit may in fact be activated upon a number of input events, such as arrival of clock edges, data, or preset or clear control signals. Thus a problem arises for systems in which data transitions and clock edges which are unrelated to each other (asynchronous) arrive in such close timing proximity that a metastable state exists in the regenerative loop, i.e., the final states to which the outputs are switched is uncertain and may go either way, which may result in error in the output data.

Prior art data storage elements have circuit topologies in which the input and output ports are coupled to the regenerative loop in such a manner that both input and output signals or data transitions within the loop are coupled to the inherent capacitance of the active devices performing the input-output coupling, in effect adding capacitance to the regenerative loop and hence reducing the speed with which the loop can leave the metastable state.

For high speed asynchronous data acquisition systems wherein a number of data storage elements may be linked together to form a shift register, the susceptibility of the data storage elements being placed in a metastable state, thus increasing the probability of error, limits the rate at which data can be acquired.

SUMMARY OF THE INVENTION

In accordance with the present invention, a data storage element having input and output ports isolated from the regenerative switching circuit thereof greatly reduces the probability of a metastable occurrence and permits data acquisition at a high rate with minimal error.

Input signals such as clock, data, etc., are applied to the control terminals of a data input pair of switching devices, and complementary outputs responsive to the inputs are taken from a pair of output terminals.

A regenerative switching circuit, or latch, which comprises a pair of control devices and a cross-coupled pair of differential switching devices to complete the loop, is coupled to the biasing network of the data input pair of switching devices. As such, the regenerative loop is associated only peripherally with the data transmission devices and yet achieves the desired latching objectives. The regenerative switching circuit may be optimized for high-speed switching by applying higher voltages to the active devices thereof than to the data transmission devices.

It is therefore one object of the present invention to provide an improved data storage element particularly suited to high-speed asynchronous data acquisition or processing systems.

It is another object of the present invention to provide a data storage element having input and output ports isolated from the regenerative switching circuit thereof thereby to significantly reduce the probability of metastable occurrence and permit data acquisition at a high rate with minimal error.

Other objects, features, and advantages of the present invention will become obvious to those having ordinary skill in the art upon a reading of the following description when taken in conjunction with the drawing.

BRIEF DESCRIPTION OF THE DRAWING

The single FIGURE is a simplified schematic of a data storage element having a regenerative switching circuit in accordance with the present invention.

DETAILED DESCRIPTION OF THE INVENTION

Referring to the single FIGURE of an exemplary embodiment of the present invention, a data input pair of switching devices comprises a pair of transistors Q1 and Q2, the emitters of which are shown coupled together and to ground potential via respective emitter resistors 10 and 12. These resistors are not absolutely required, and are chosen to be fairly high value to provide a prebias trickle current. The base of transistor Q1 is connected to an input terminal 14, while the collector thereof is connected to an output terminal 16 and through a collector-load resistor 18 to a suitable collector-voltage supply $+V_{cc}$. Similarly, the base of transistor Q2 is connected to an input terminal 20, while the collector thereof is connected to an output terminal 22 and through a collector load resistor 24 to the collector-voltage supply.

The regenerative switching circuit, or latch, shown enclosed by a dashed line, comprises four transistors Q3, Q4, Q5, and Q6, and associated passive biasing components. Transistors Q3 and Q6 are a pair of control devices which receive signals transmitted to the bases thereof from the emitters of transistors Q1 and Q2 via resistors 30 and 32, respectively. Resistors 30 and 32 are also collector-load resistors for a cross-coupled pair of differential switching devices, as will be seen shortly. The emitters of transistors Q3 and Q6 are connected to a suitable emitter-voltage supply $-V_{EE}$ through resistors 34 and 36, while the collectors thereof are connected to a suitable collector-voltage supply $+V_S$. Transistors Q4 and Q5 comprise a cross-coupled pair of differential switching devices, the emitters of which are coupled together and to the emitter-voltage supply via latch-current source resistor 40. The base of transistor Q4 is connected to the emitter of transistor Q3, while the Q4 collector is cross-coupled to the base of transistor Q6 and to resistor 32. Similarly, the base of transistor Q5 is connected to the emitter of transistor Q6, while the Q5 collector is cross-coupled to the base of transistor Q3 and to resistor 30.

To completely understand the circuit operation, assume a steady-state condition in which input terminal 20 has a high logic input applied thereto while input terminal 14 has a low logic input applied thereto. In this condition, the voltage at the emitter of transistor Q2 is positive with respect to the voltage at the emitter of transistor Q1 as these two transistors have some amount of emitter current due to the presence of resistors 10 and 12. The values of latch-current source resistor 40 and load resistors 30 and 32 are chosen such that the maximum voltage impressed across resistors 30 and 32 at any given time is less than the differential voltage between terminals 20 and 14, the bases of the input active devices. Thus, in the steady-state condition example being described, the voltage at the base of transistor Q6 is positive (although perhaps only slightly) with respect to the base voltage of transistor Q3. Transistors Q3 and Q6 are always both conducting because of their biasing networks, and consequently the base voltage difference therebetween is coupled to the bases of transistors Q4 and Q5. Transistor Q5, with its base voltage positive with respect to the base voltage of transistor Q4, is on while transistor Q4 is off. The latch-current through resistor 40 therefore passes almost entirely through transistor Q5, resistor 30, transistor Q1, and resistor 18. Thus the output at terminal 16 is low because of the voltage developed across resistor 18, and the output at terminal 22 is high because with perhaps only a leakage-current flow through resistor 24, the collector voltage of transistor Q2 is close to $+V_{cc}$.

Now assume that the inputs switch states, that is, input terminal 20 is pulled low while input terminal 14 is pulled high. The high-going transition at terminal 14 is transmitted by emitter-follower action of transistors Q1 and Q3 to the base of transistor Q4, while the low-going transition at terminal 20 is likewise transmitted by emitter-follower action of transistors Q2 and Q6 to the base of transistor Q5. Transistors Q4 and Q5 switch, with Q4 now conducting and Q5 now turning off as latch current is shifted from resistor 30 to resistor 32. This action is regenerative, that is, as current through resistor 30 decreases, the voltage at the base of transistor Q3 rises positive, and as the current through resistor 32 increases, the voltage at the base of transistor Q6 is pulled negative. Thus, the switching is reinforced, and at substantially the same time, transistors Q1 and Q2 complete their switching action due to the current shift from one to the other as output terminal 16 is pulled high and output terminal 22 is pulled low.

From the foregoing description, it can be seen that the data transmission through the data input pair of transistors Q1 and Q2 is isolated from the latch, and that the regenerative loop of the latch is associated only peripherally with the data transmission devices and yet achieves the desired latching results.

Note also that the collector voltage $+V_s$ applied to transistors Q3 and Q6 may be higher than $+V_{cc}$ applied to Q1 and Q2. For example, while $+V_{cc}$ may be $+5$ volts to establish suitable high logic levels, $+V_s$ may be substantially higher, e.g., $+15$ or 20 volts, to enhance switching speed of the latch transistors by reducing the effects of parasitic capacitance which would otherwise add to the time constant of the loop.

Basically, an improved flip-flop has been described in which input terminals 14 and 20 represent R and S inputs, respectively, while output terminals 16 and 22 represent Q and $\overline{Q}$ outputs. Actually, input terminals 14 and 20 may receive all of the inputs usually associated with flop-flops, including complementary clock signals C and $\overline{C}$, complementary data signals, D and $\overline{D}$, and so forth. While these various inputs are represented here as signals applied via resistors to terminals 14 and 20, it would be well within the purview of one skilled in the art to implement these inputs using further differential pairs of transistors and appropriate current sources. The simplified circuit is to illustrate that these inputs may all be isolated from the latch. It should be pointed out that the latch is also operable without the emitter-follower transistors Q3 and Q6, and in some situations where lower power consumption or slower switching speeds may be tolerated they may be omitted.

Also, while bipolar NPN transistors are shown as an exemplary embodiment, other active devices such as field-effect transistors may be used as well without compromising the improved circuit operation of the present invention.

Thus, while I have shown and described a preferred embodiment of my invention, it will become obvious to those having ordinary skill in the art that many changes and modifications may be made without departing from my invention in its broader aspects.

I claim:

1. A data storage element, comprising:
   a pair of input ports and a pair of output ports;
   a data input pair of switching devices comprising first and second transistors, each having a base coupled to a respective input port, a collector coupled to a respective output port, and an emitter, said switching devices having two stable operating states and being responsive to at least one input binary signal for producing a pair of complementary output binary signals at said output ports; and
   regenerative switching means comprising third and fourth transistors, each having a base coupled to a respective emitter of said first and second transistors, a collector cross-coupled to said respective emitters of said first and second transistors, and an emitter, the emitters of said third and fourth transistors being coupled together to form an emitter-coupled pair of transistors, and a current generator coupled to the emitters of said third and fourth transistors, said regenerative switching means also being responsive to said binary input signals for switching the operating states of said switching devices.

2. A data storage element in accordance with claim 1 comprising a first emitter follower stage coupled between the emitter of said first transistor and the base of said third transistor, and a second emitter follower stage coupled between the emitter of said second transistor and the base of said fourth transistor.

* * * * *